(12) United States Patent
Kurimoto

(10) Patent No.: US 9,634,205 B2
(45) Date of Patent: Apr. 25, 2017

(54) LIGHT EMITTING DEVICE AND IMAGE DISPLAY UNIT

(71) Applicant: NICHIA CORPORATION, Anan-Shi (JP)

(72) Inventor: Takeo Kurimoto, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 63 days.

(21) Appl. No.: 14/300,985

(22) Filed: Jun. 10, 2014

(65) Prior Publication Data

US 2014/0291710 A1 Oct. 2, 2014

Related U.S. Application Data

(63) Continuation of application No. 13/204,180, filed on Aug. 5, 2011, now Pat. No. 8,809,896.

(30) Foreign Application Priority Data

Aug. 6, 2010 (JP) .................................. 2010-177193
Jun. 1, 2011 (JP) .................................. 2011-123635

(51) Int. Cl.
| | | |
|---|---|---|
| *H01L 33/08* | (2010.01) | |
| *H01L 33/56* | (2010.01) | |
| *G09F 9/33* | (2006.01) | |
| *H01L 25/075* | (2006.01) | |
| *H01L 33/48* | (2010.01) | |
| *H01L 33/62* | (2010.01) | |

(Continued)

(52) U.S. Cl.
CPC ............ *H01L 33/56* (2013.01); *G09F 9/3026* (2013.01); *G09F 9/33* (2013.01); *H01L 25/0753* (2013.01);
(Continued)

(58) Field of Classification Search
CPC ........ H01L 33/62; H01L 33/56; H01L 25/075
(Continued)

(56) References Cited

U.S. PATENT DOCUMENTS 6,274,890 B1* 8/2001 Oshio .................. H01L 33/486
257/100
2001/0022390 A1 9/2001 Waitl et al.
(Continued)

FOREIGN PATENT DOCUMENTS

| JP | 10261821 | 9/1998 |
|---|---|---|
| JP | 2002223005 | 9/2002 |

(Continued)

OTHER PUBLICATIONS

Japanese Office Action dated May 20, 2014, issued in corresponding Japanese Patent Application No. 2011-123635, 3 pages. No copy provided, per MPEP 609. Copy submitted in parent Application No. 13/204,180.

*Primary Examiner* — Asok K Sarkar
*Assistant Examiner* — Dmitriy Yemelyanov
(74) *Attorney, Agent, or Firm* — Squire Patton Boggs (US) LLP

(57) ABSTRACT

A light emitting device includes a package having a recess, a lead frame buried in the package so that one end of the lead frame is exposed at a bottom of the recess and another end protrudes to an exterior of the package, a light emitting element arranged on the lead frame exposed at the bottom of the recess, and an encapsulant filled in the recess. The package includes, at the side face where the lead frame protrudes, a first side face formed inwardly relative to a side face of the lead frame, and a second side face formed at a lower portion of the first side face and protruded so as to cover a top face of the lead frame.

12 Claims, 11 Drawing Sheets

(51) Int. Cl.
*G09F 9/302* (2006.01)
*H01L 33/44* (2010.01)
*H01L 33/60* (2010.01)

(52) U.S. Cl.
CPC ............ *H01L 33/486* (2013.01); *H01L 33/62* (2013.01); *H01L 33/44* (2013.01); *H01L 33/60* (2013.01); *H01L 2224/48091* (2013.01); *H01L 2224/48247* (2013.01)

(58) Field of Classification Search
USPC .................................................... 257/73–103
See application file for complete search history.

(56) References Cited

U.S. PATENT DOCUMENTS

| | | | |
|---|---|---|---|
| 2002/0039001 A1* | 4/2002 | Nagai | H01L 25/0753 313/512 |
| 2004/0046242 A1* | 3/2004 | Asakawa | H01L 31/0203 257/678 |
| 2005/0139846 A1 | 6/2005 | Park et al. | |
| 2005/0280014 A1 | 12/2005 | Park et al. | |
| 2006/0022216 A1 | 2/2006 | Chikugawa | |
| 2006/0273338 A1 | 12/2006 | Lee et al. | |
| 2008/0001160 A1 | 1/2008 | Andrews | |
| 2008/0277677 A1 | 11/2008 | Kuo et al. | |
| 2008/0299787 A1* | 12/2008 | Chung | F21K 9/00 439/56 |
| 2011/0241028 A1* | 10/2011 | Park | H01L 33/486 257/88 |

FOREIGN PATENT DOCUMENTS

| | | |
|---|---|---|
| JP | 200649442 | 2/2006 |
| JP | 200693738 | 4/2006 |
| JP | 2007180591 | 12/2007 |
| JP | 2009-026846 A | 2/2009 |
| JP | 3155112 U | 10/2009 |

* cited by examiner

LIGHT EMITTING DEVICE AND IMAGE DISPLAY UNIT

CROSS REFERENCE TO RELATED APPLICATION

This is a Continuation of application Ser. No. 13/204,180 filed Aug. 5, 2011, which claims the foreign priority benefit under Title 35, United States Code, Section 119(a)-(d) of Japanese Patent Application No. 2010-177193 filed on Aug. 6, 2010, and Japanese Patent Application No. 2011-123635 filed on Jun. 1, 2011. The disclosures of the prior applications are hereby incorporated by reference herein in their entirety.

BACKGROUND

Field

The present invention relates to a surface-mount type light emitting device and an image display unit using the same.

Description of the Related Art

Lamp type LEDs are often used as light emitting devices that configure respective pixels of an image display device (a display) placed in an outdoor location. However, from the standpoint of downsizing, thinning, or heat dissipation, surface-mount type (SMD type) LEDs are gradually becoming popular.

Following technologies are proposed as such a surface-mount type light emitting device. For example, JP H10-261821 A (see FIG. 9B) discloses a light emitting device that includes a resin stem and a protrusive part which covers the whole upper surface of the resin stem and the whole upper side surface with a light transmissive thermosetting resin, thereby improving the moisture resistance and the light emitting efficiency. Also, JP 2006-049442 A (see FIG. 1) discloses a light emitting device that has a heat dissipation member provided on the rear surface of a lead frame via a conductive layer including a metal, thereby improving the heat dissipation characteristic. Also, JP 2006-093738 A (see FIGS. 4 and 10) discloses a light emitting device that has a first recess which is formed in the stem and where a semiconductor element is mounted and a second recess formed around the first recess in order to make the amount of encapsulation material encapsulating the semiconductor element always constant.

When the light emitting devices disclosed in JP H10-261821 A, JP 2006-049442 A, and JP 2006-093738 A are used as pixels of an image display device placed in an outdoor location, for example, as shown in FIG. 11A, in order to prevent moisture due to rain water, humidity, etc., from entering into the interior of a light emitting device 101, a side (a surrounding area) of the light emitting device 101, in particular, a boundary between a package 110 and a lead frame 120 where moisture is likely to enter is covered by a waterproof resin 102 formed of a silicon resin or the like.

However, the surface-mount type light emitting devices are small in height in comparison with the lamp type light emitting devices, so that the amount of waterproof resin that can be used is little by what corresponds to such smallness. Hence, according to the conventional light emitting device 101, as shown in FIG. 11B, when it is used for a long period, the waterproof resin 102 repeats expansion and shrinkage due to heat by sunlight or the like, and the waterproof resin and the package resin are deteriorated by moisture and ultraviolet, and thus the waterproof resin 102 may be peeled from the package 110.

As shown in FIG. 11B, when such peeling of the waterproof resin 102 reaches the lead frame 120, moisture enters to a light emitting element 130 inside the light emitting device 101 from the boundary between the package 110 and the lead frame 120, and the light emitting element 130 becomes unable to emit light.

The present invention has been made in view of such a problem, and it is an object of the present invention to provide a surface-mount type light emitting device and an image display unit which suppress peeling of a waterproof resin to a boundary between a package and a lead frame where moisture is likely to enter in order to prevent the moisture like rain water from entering therein even if the waterproof resin covering a side of the light emitting device starts peeling and which are excellent in waterproofing.

SUMMARY

In order to achieve the above object, a first aspect of the present invention provides a surface-mount type light emitting device that includes: a package having a recess formed in an upper face thereof; a pair of lead frames buried in the package so that respective one ends of the pair of lead frames are exposed at a bottom of the recess and respective another ends of the pair of lead frames protrude to an exterior from a side face of the package; a light emitting element arranged on the upper face of at least either one of the pair of lead frames exposed at the bottom of the recess; and an encapsulant filled in the recess, in which the package includes, at the side face where the pair of lead frames protrudes: a first side face formed inwardly relative to a frame side face of the pair of lead frames; and a second side face formed at a lower portion of the first side face and protruded so as to cover a top face of the pair of lead frames.

When such a light emitting device employing the above-explained structure is used in an outdoor location and the side face thereof is covered by the waterproof resin, even if the waterproof resin starts peeling due to a long-term use, the waterproof resin can be prevented from being peeled to a boundary between the package and the lead frame where moisture is likely to enter by the step formed between the first side face formed inwardly relative to the frame side face of the lead frame and the second side face protruding so as to cover respective upper faces of the pair of lead frames, and thus entering of moisture like rain water can be suppressed. When the light emitting device is used in not only an outdoor location but also an indoor location, the package side face of the light emitting device may be covered by the waterproof resin in order to enhance the waterproof performance, and in this case, the same effect can be obtained.

It is preferable that the pair of lead frames protruding to the exterior from the side face of the package should be bent along the side face of the package and a bottom face thereof, the first side face should be formed inwardly relative to the frame side face of the pair of bent lead frames, and the second side face should protrude so as to cover an upper part of a bent portion of the pair of lead frames.

According to the light emitting device employing such a structure, since the second side face protrudes so as to cover the upper part of the bent portion of the pair of lead frames, entering of moisture like rain water into the interior of the light emitting device can be further effectively prevented.

It is preferable that the package should further include a groove that is formed between the first side face and the second side face in a thickness direction of the package at a predetermined depth.

According to the light emitting device employing such a structure, when it is used in an outdoor location and the side face thereof is covered by the waterproof resin, even if the waterproof resin may possibly start peeling due to a long-term use, the groove formed between the first side face and the second side face can prevent the waterproof resin from being peeled from the package. Also, even if the waterproof resin is peeled from the side face, the light emitting device can prevent moisture like rain water from entering therein by the groove.

It is preferable that the package should further includes, on a side face of the package which is closer to a light-emitting-surface of the light emitting device than the first side face, a third side face formed inwardly relative to the first side face.

According to the light emitting device employing such a structure, when it is used in an outdoor location and the side face thereof is covered by the waterproof resin, even if the waterproof resin starts peeling due to a long-term use, the step formed between the first side face and the second side face can prevent the waterproof resin from being peeled from the package, thereby preventing moisture like rain water from entering in the light emitting device. Also, when the light emitting device is used in an outdoor location and the side face thereof is covered by the waterproof resin, the waterproof resin can be applied with reference to the third side face.

It is preferable that a height of the first side face in the thickness direction of the package should be larger than a height of the second side face in the thickness direction of the package.

According to the light emitting device employing such a structure, when it is used in an outdoor location and the side face thereof is covered by the waterproof resin, the area of the first side face that is a reference for application of the waterproof resin can be taken larger than the area of the second side face, and the waterproof resin can be applied so that the end of the waterproof resin is located within a plane of the first side face.

In order to achieve the above object, a second aspect of the present invention provides an image display unit that includes: a circuit board including the plurality of light emitting devices explained above; and a waterproof resin that is formed so as to cover a side face of the package and the frame side face of each of the plurality of light emitting devices on the circuit board.

According to the image display unit employing such a structure, since the side face of the package and the side face of the frame are covered by the waterproof resin, it is possible to prevent moisture like rain water from entering in the light emitting device.

It is preferable that the image display unit of the present invention should further include a frame member which is formed with a plurality of openings, and which is joined with the circuit board, the plurality of light emitting devices being arranged in the plurality of openings.

Since the image display unit employing such a structure includes the frame member, the circuit board and the waterproof resin on the circuit board can be protected.

It is preferable that the waterproof resin should be formed so as to cover the frame side face and the second side face and a part of the first side face.

According to the image display unit employing such a structure, since the waterproof resin is formed up to a location within a plane of the first side face of the package, it is possible to surly prevent moisture like rain water from entering in the light emitting device.

In order to achieve the above-object, a third aspect of the present invention provides an image display unit that includes: a light emitting device; a circuit board including the plurality of light emitting devices; and a waterproof resin formed on the circuit board, in which the light emitting device is a surface-mount type light emitting device and includes: a package having a recess formed in an upper face thereof; a pair of lead frames buried in the package so that respective one ends of the pair of lead frames are exposed at a bottom of the recess and respective another ends of the pair of lead frames protrude to an exterior from a side face of the package; a light emitting element arranged on the upper face of at least either one of the pair of lead frames exposed at the bottom of the recess; and an encapsulant filled in the recess, the waterproof resin is formed on the circuit board so as to cover a side face of the package and a side face of the frame of each of the plurality of light emitting devices, and the package includes, at the side face where the pair of lead frames protrudes: a first side face formed inwardly relative to a frame side face of the pair of lead frames; and a second side face formed at a lower portion of the first side face and protruded beyond the first side face.

Since the image display unit employing such a structure includes the waterproof resin covering the side face of the package and the side face of the frame, it is possible to prevent moisture like rain water from entering in the light emitting device. Also, even if the waterproof resin starts peeling due to a long-term use, the waterproof resin can be prevented from being peeled to a boundary between the package and the lead frame where moisture is likely to enter by the step formed between the first side face formed inwardly relative to the frame side face of the lead frame and the second side face protruding beyond the first side face, and thus the image display unit can prevent moisture like rain water from entering therein.

It is preferable that the pair of lead frames protruding to the exterior from the side face of the package should be bent along the side face of the package and a bottom face thereof, the first side face should be formed inwardly relative to the frame side face of the pair of bent lead frames, and the second side face should protrude so as to cover an upper part of a bent portion of the pair of lead frames.

According to the image display unit employing such a structure, since the second side face protrudes so as to cover the upper part of the bent portion of the pair of lead frames, it is possible to further effectively prevent moisture like rain water from entering in the light emitting device.

It is preferable that the waterproof resin should be formed so as to cover the frame side face and the second side face and a part of the first side face.

According to the image display unit employing such a structure, since the waterproof resin is formed up to a location within a plane of the first side face of the package, it is possible to further surely prevent moisture like rain water from entering in the light emitting device.

BRIEF DESCRIPTION OF THE DRAWINGS

FIG. 1A is a diagram showing a state in which no waterproof resin is peeled and FIG. 1B is a diagram showing a state in which the waterproof resin is partially peeled;

FIG. 4A is a perspective view showing a whole structure of the image display unit, and FIG. 4B is an exploded perspective view showing a whole structure of the image display unit;

FIG. 5A is a diagram showing an image display device, and FIG. 5B is a diagram showing the image display unit configuring the image display device and the light emitting device configuring the image display unit;

FIG. 6A is a diagram showing a process of arranging a light emitting device, FIG. 6B is a diagram showing a process of applying a waterproof resin, and FIG. 6C is a diagram showing a process of attaching a frame member;

FIG. 7A is a diagram showing a state in which no waterproof resin is peeled and FIG. 7B is a diagram showing a state in which the waterproof resin is partially peeled;

FIG. 8A is a diagram showing a state in which no waterproof resin is peeled and FIG. 8B is a diagram showing a state in which the waterproof resin is partially peeled;

FIG. 9A is a diagram showing a state in which no waterproof resin is peeled and FIG. 9B is a diagram showing a state in which the waterproof resin is partially peeled;

FIG. 11A is a diagram showing a state in which no waterproof resin is peeled and FIG. 11B is a diagram showing a state in which the waterproof resin is partially peeled.

DETAILED DESCRIPTION

Figure 1A:
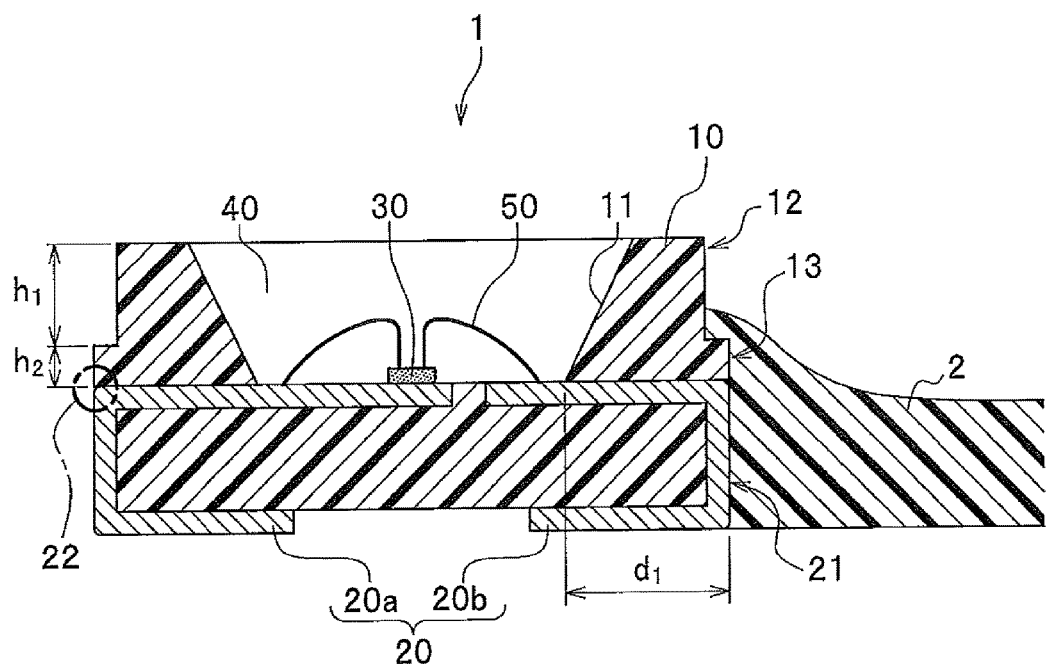
FIGS. 1A and 1B are cross-sectional views taken along A-A line of FIG. 3 and showing a structure of a light emitting device according to a first embodiment of the present invention.

An explanation will be given of a light emitting device and an image display unit according to embodiments of the present invention with reference to the accompanying drawings. The dimensions (an area, a thickness, etc.) of members shown in respective drawings and the positional relationship thereof and the like are exaggerated in some cases in order to clarify the explanation. In the following explanation, the same name and reference numeral basically denote the same or similar member, and the duplicated detailed explanation will be omitted accordingly.

First Embodiment

A detailed explanation will be given of a light emitting device 1 of a first embodiment with reference to FIGS. 1A to 3 and FIGS. 5A and 5B. In order to facilitate understanding through the explanation, in FIG. 3, an encapsulation member 40 is illustrated in a transparent manner.

Figure 1B:
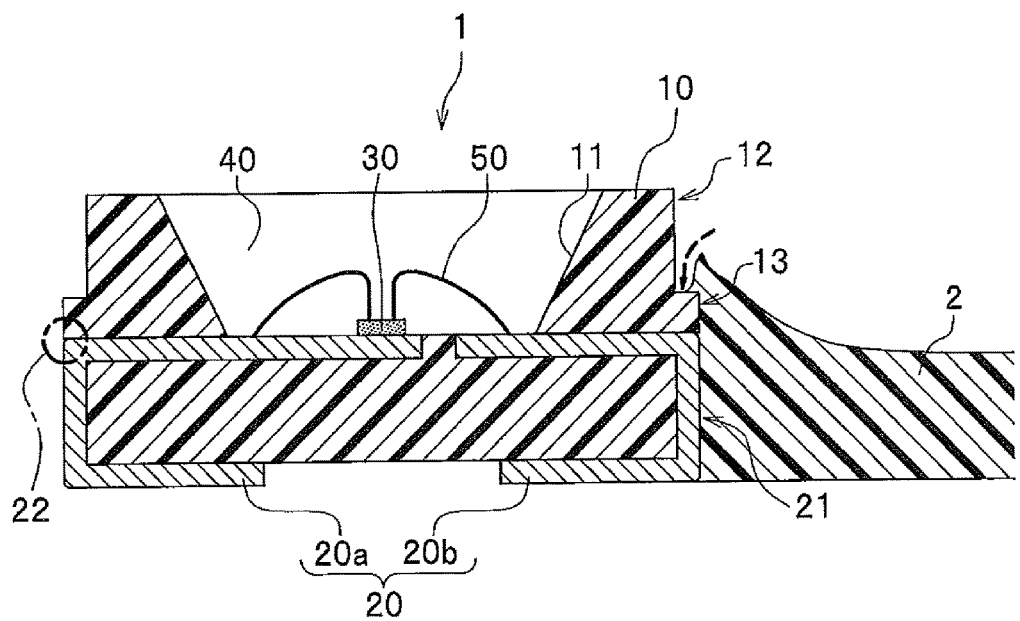

A light emitting device 1 is a surface-mount type used for an image display device (a display) mainly placed in an outdoor location. In the specification, as shown in FIGS. 1A and 1B, the surface-mount type (SMD type) light emitting device has lead frames 20 exposed in a recess 11 of a package 10 and has light emitting elements 30 on respective lead frames 20 in a surface-mount manner.

Figure 5A:
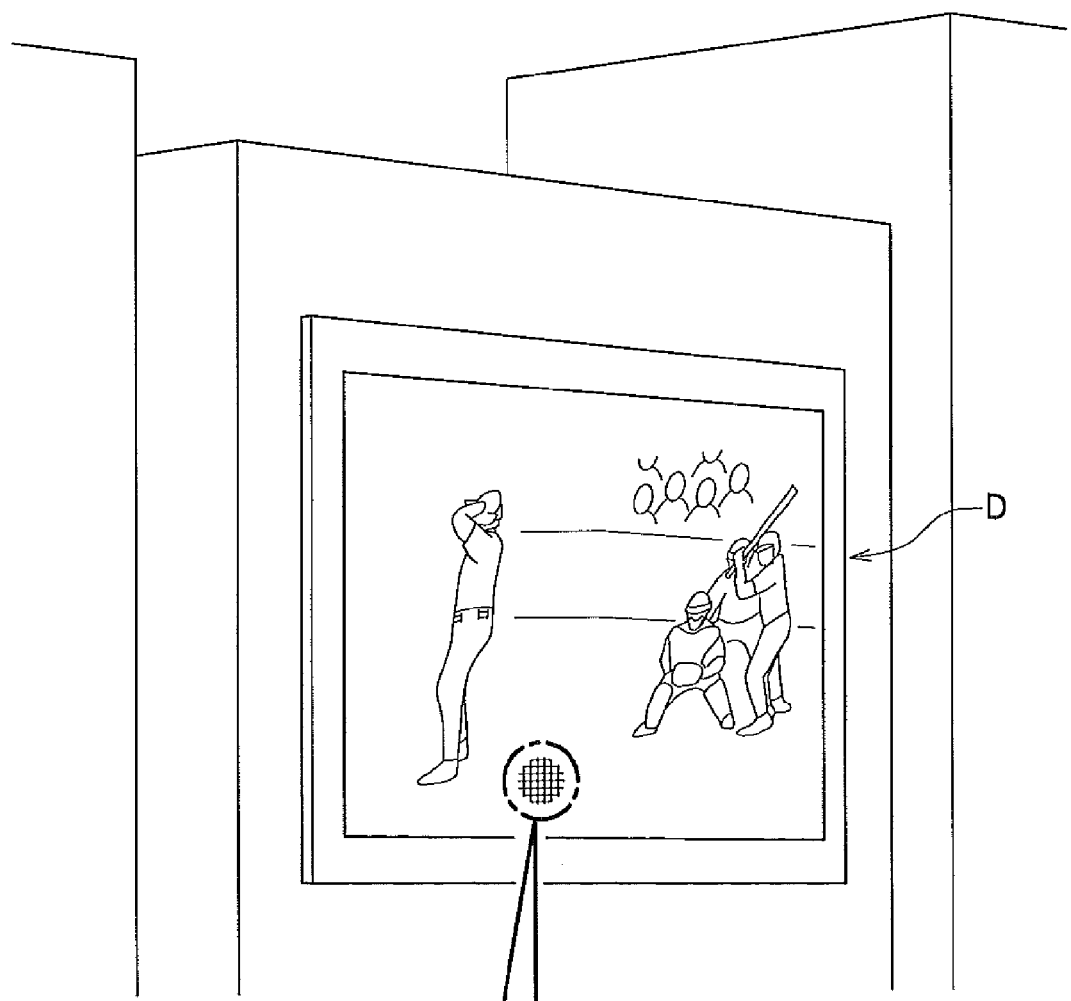
FIGS. 5A and 5B are schematic diagrams showing an illustrative image display device using the light emitting device according to the first embodiment of the present invention.
Figure 5B:
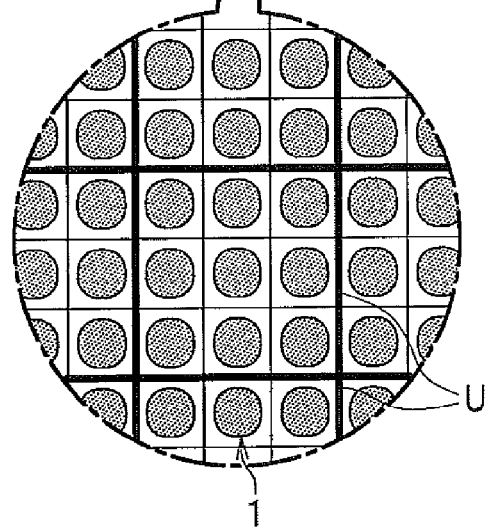

As shown in, for example, FIGS. 5A and 5B, the light emitting device 1 is used as each pixel configuring an image display device D. When it is viewed through a cross-sectional view, as shown in FIGS. 1A and 1B, the light emitting device 1 includes the package 10, a pair of lead frames 20, the light emitting element 30, the encapsulation member 40, and wires 50. In the following explanation, in order to explain the relationship between the light emitting device 1 and the waterproof resin 2, as shown in FIGS. 1A and 1B, the explanation will be given with a waterproof resin 2 covering a side of the light emitting device 1 being illustrated. Also, the waterproof resin 2 is formed so as to cover the surrounding of the light emitting device 1, but in FIGS. 1A, 1B and other drawings, in order to facilitate understanding through the explanation, only one side of the light emitting device 1 is covered by the waterproof resin 2.

<Package>

The package 10 is a member for arranging electronic components like the light emitting element 30. As shown in FIGS. 1A and 1B, the recess 11 with a predetermined depth is formed on the upper surface of the package 10. The recess 11 is a region where the light emitting element 30 is arranged, and as shown in FIGS. 1A and 1B, the pair of lead frames 20 are arranged so that respective one ends thereof face with each other at the bottom of the recess 11 and the light emitting element 30 is arranged on the upper surface of one of the pair of lead frames 20.

Figure 2:
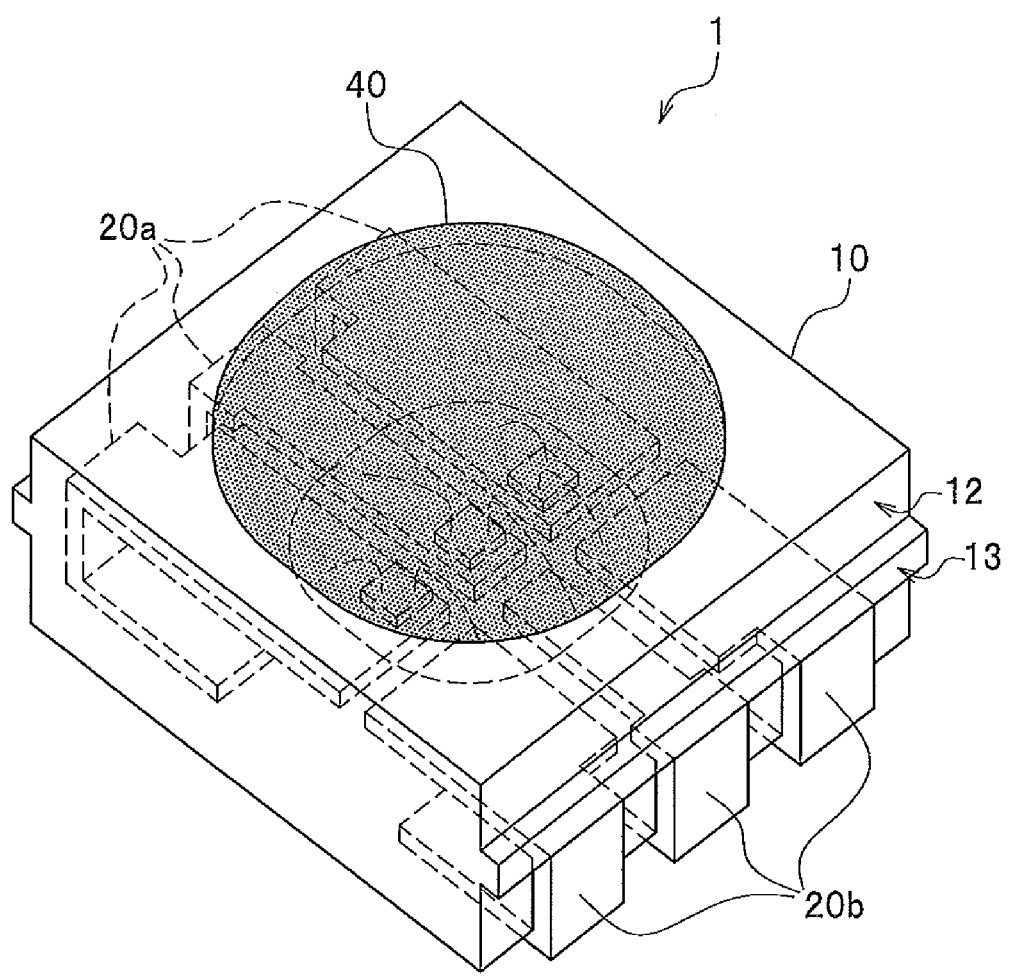
FIG. 2 is a perspective view showing a whole structure of the light emitting device according to the first embodiment of the present invention.

As shown in FIGS. 1A to 3, the package 10 has a first side face 12 and a second side face 13 at a side where the pair of lead frames 20 are arranged. As shown in FIGS. 1A and 1B, the first side face 12 is formed inwardly of a frame side face 21 of the pair of folded lead frames 20. Also, as shown in FIG. 2, the first side face 12 and the second side face 13 are formed across two side faces of the package 10 where the pair of lead frames are formed. How much the first side face 12 is formed inwardly relative to the frame side face 21 is not limited to any particular case, and can be changed as needed depending on how much it is covered by the waterproof resin 2.

As shown in FIGS. 1A and 1B, the second side face 13 is formed continuously with the first side face 12 at a lower part thereof, and protrudes from the first side face 12. Also, as shown in FIGS. 1A and 1B, the second side face 13 is protrudingly formed so as to cover the upper part of the lead frame 20, more preferably, so as to cover the upper part of a bent portion 22 of the lead frame 20. Hence, as viewed in a cross-sectional view shown in FIGS. 1A and 1B, the second side face 13 is in a shape protruding convexly above the bend portion 22 of the lead frame 20.

As shown in FIG. 1A, when a side face of the light emitting device 1 is covered by the waterproof resin 2, the waterproof resin 2 repeats expansion and shrinkage due to a long-term use, and as shown in FIG. 1B, may be peeled from the first side face 12. However, the light emitting device 1 can suppress further peeling of the waterproof resin 2 by a step (indicated by a dashed arrow in FIG. 1B) formed by the first side face 12 and the second side face 13, thereby preventing moisture like rain water from entering therein.

Figure 11A:
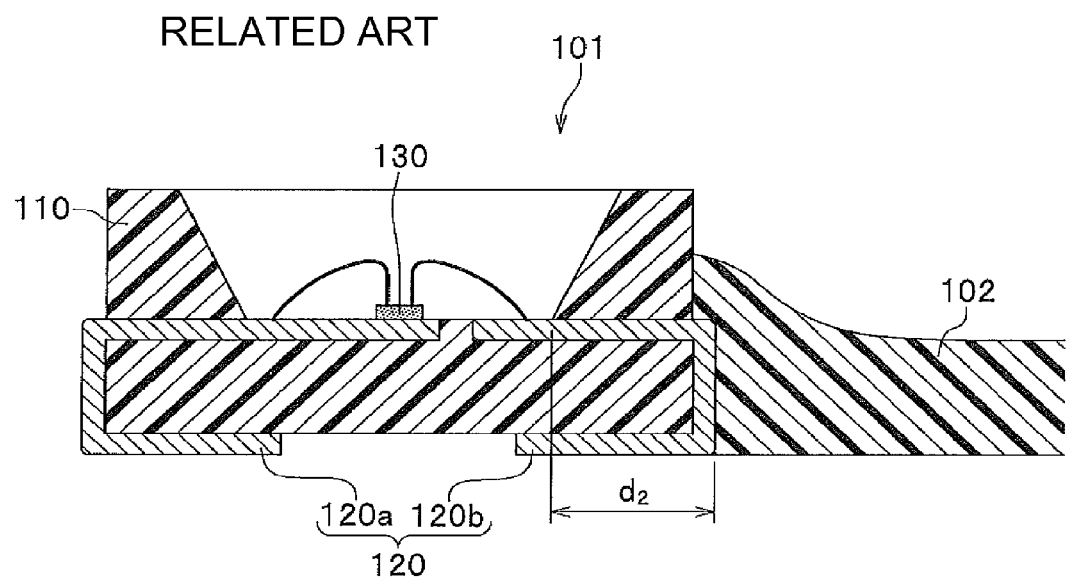
FIGS. 11A and 11B are cross-sectional views showing a structure of a light emitting device of the related art.
Figure 11B:
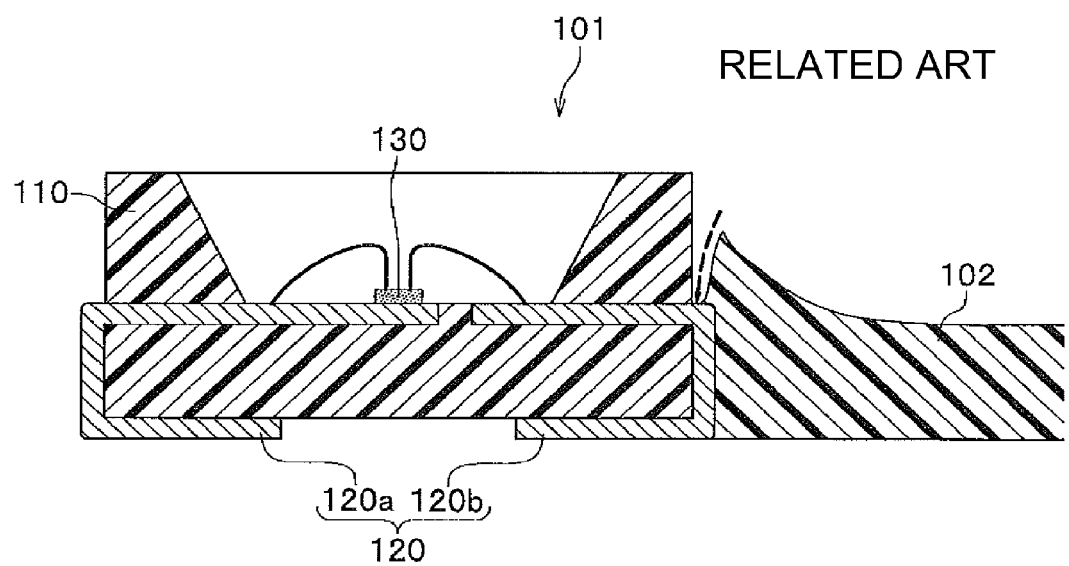

Also, as shown in FIGS. 1A and 1B, the second side face 13 is formed so that the protruding side face thereof has a length equal to or longer than that of the frame side face 21 of the lead frame 20. In this embodiment, the side face protruding length of the second side face 13 is substantially equal to that of the frame side face 21, i.e., as shown in FIGS. 1A and 1B, the second side face 13 and the frame side face 21 are flat and form a common plane. Accordingly, as shown in FIG. 1A, the light emitting device 1 can elongate a distance d1 from the side face of the package 10 to the interior of the light emitting device 1 which becomes a moisture entering path when the waterproof resin 2 is peeled more than a distance $d_2$ (see FIG. 11A) of a light emitting device 101 of a related art. Accordingly, since the light emitting device 1 can ensure the longest moisture entering path at maximum when the waterproof resin 2 is peeled, the light emitting device 1 can improve the waterproof performance. Also, like the light emitting device 101 of the related art, when the upper face of the lead frame 120 protrudes from the package 110, moisture entering from a space between the waterproof resin 2 and the package 110 is likely to enter the interior of the light emitting device 101 (see FIG. 11B) through the upper face of the lead frame 120. Accordingly, as shown in FIGS. 1A and 1B, by completely covering the upper face of the lead frame 20 by the package 10, even if the peeling of the waterproof resin 2 progresses and reaches the lead frame 20, the light emitting device can be caused to suppress entering of moisture.

It is not illustrated in the figure but the second side face 13 may be formed so that the side face protruding length thereof is longer than that of the frame side face 21 of the lead frame 20. In other words, the frame side face 21 of the lead frame 20 may be arranged inwardly of the second side face 13. In this case, also, the light emitting device 1 can elongate a distance from the side face of the package 10 to the interior of the light emitting device 1 which becomes a moisture entering path when the waterproof resin 2 is peeled more than the distance $d_2$ (see FIG. 11A) of the light emitting device 101 of the related art. Accordingly, the light emitting device 1 can ensure the longest moisture entering path at maximum when the waterproof resin 2 is peeled, so that the light emitting device 1 can improve the waterproof performance.

When the side face of the light emitting device 1 is covered by the waterproof resin 2, as shown in FIG. 1A, it is preferable for the waterproof resin 2 to have an end located within a plane of the first side face 12. However, the position of the end of the waterproof resin 2 is often misaligned in manufacturing. Accordingly, as shown in FIG. 1A, it is preferable that the the package 10 should be formed so that a height $h_1$ of the first side face 12 in the thickness direction of the package 10 is larger than a height $h_2$ of the second side face 13 in the thickness direction of the package 10. Accordingly, when the side face of the light emitting device 1 is covered by the waterproof resin 2 and the light emitting device 1 is used in an outdoor location, the larger area of the first side face 12 is ensured than the area of the second side face 13, and thus application of the waterproof resin 2 becomes easy so that the end of the waterproof resin 2 is located within a plane of the first side face 12. Since the light emitting device 1 allows application of the waterproof resin 2 with reference to the first side face 12, the covered level by the waterproof resin 2 can be made constant, thereby improving the waterproof performance. Also, since the first side face 12 is covered by the waterproof resin 2 in this fashion, the first side face 12 is exposed without being covered by an encapsulation member or a lens member, etc.

The size of the package 10 is not limited to any particular size, and can be selected accordingly depending on the number of light emitting elements 30 and the purpose and the application. Also, it is preferable that the material of the package 10 should be an insulative material, and should be also a material which does not easily allow light emitted from the light emitting element 30 or external light to pass therethrough and which has a strength to some level. Specific examples of the material of the package 10 are ceramics (e.g., $Al_2O_3$, AlN), or a resin, such as a phenol resin, an epoxy resin, a polyimide resin, a BT resin (bismaleimide triazine resin), or a polyphthalamide resin (PPA).

<Lead Frame>

The lead frames 20 are electrodes which electrically connect the electrical component like the light emitting element 30 with an unillustrated external power source and which apply a voltage to the electrical component from the external power source. As shown in FIGS. 1A to 3, the lead frames 20 include lead frames 20a and 20b which serve as a positive electrode or a negative electrode, respectively.

As shown in FIGS. 1A to 2, the lead frames 20a and 20b are each formed of a tabular metal member. As shown in FIGS. 1A to 3, the lead frames 20a and 20b have respective one ends exposed at the bottom of the recess 11 of the package 10, and have respective another ends buried in the package 10 so as to protrude to the exterior from the side face of the package 10. As shown in FIGS. 1A to 2, the lead frames 20a and 20b protruding to the exterior from the side face of the package 10 are bent along the side face of the package 10 and the lower face thereof.

Figure 3:
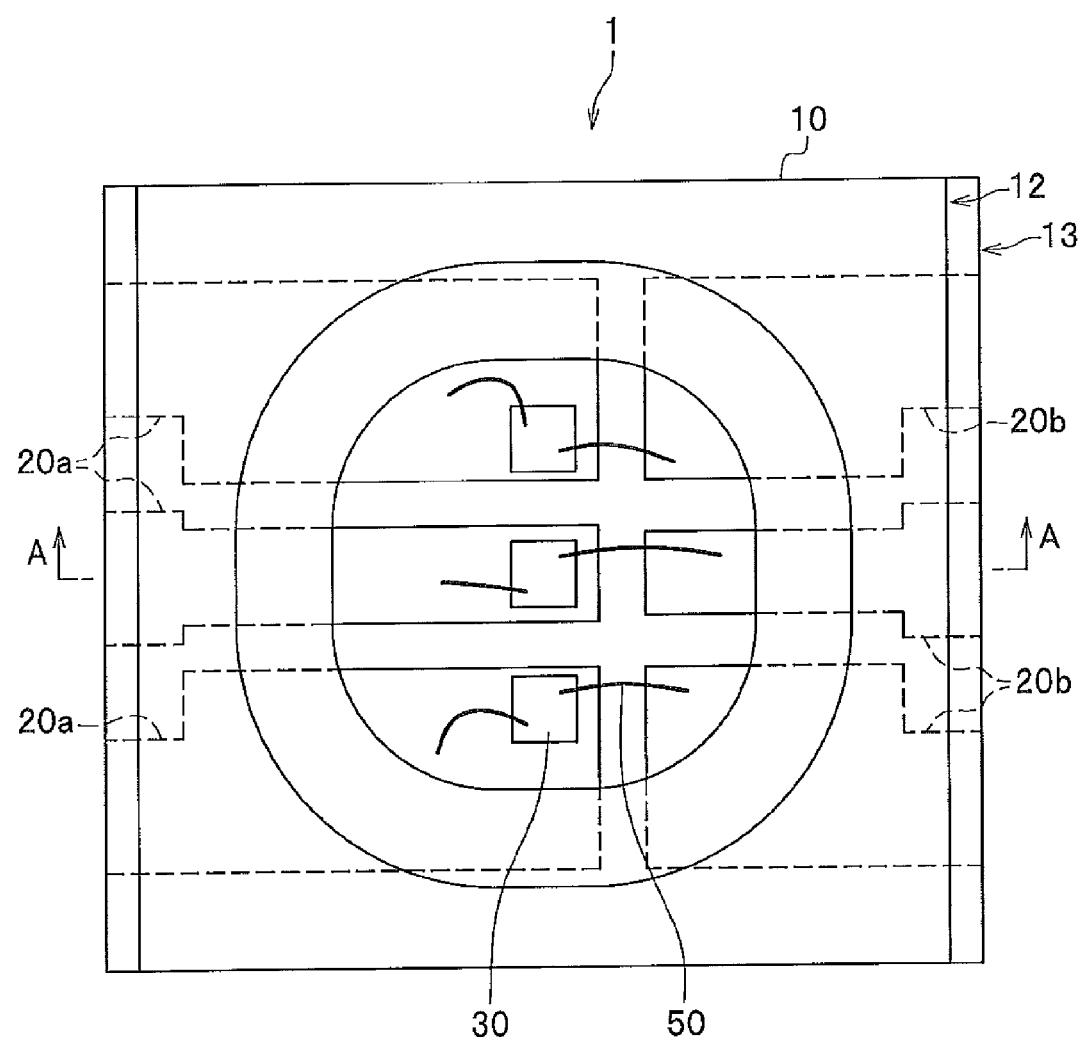
FIG. 3 is a plan view showing a whole structure of the light emitting device according to the first embodiment of the present invention.

As shown in FIGS. 1A and 1B, the light emitting element 30 is arranged on the upper face of the lead frame 20a. As shown in FIGS. 1A, 1B and 3, the light emitting element 30 arranged on the upper face of the lead frame 20a is electrically connected to the lead frames 20a and 20b through wires 50. It is fine if the light emitting element 30 is arranged on the upper face of at least either one of the lead frames 20a and 20b, and for example, may be arranged on the upper face of the lead frame 20b or on both upper faces of the lead frames 20a and 20b.

Respective sizes of the lead frames 20a and 20b are not limited to any particular sizes, and can be selected accordingly depending on the number of light emitting elements 30 and the purpose and the application. An example material of the lead frames 20a and 20b is a Cu alloy having a surface thereof plated with Au or Ag.

<Light Emitting Element>

The light emitting element 30 is a semiconductor element that emits light when a voltage is applied. As shown in FIGS. 1A and 1B, the light emitting element 30 is arranged on the upper face of the lead frame 20a. As shown in FIGS. 1A, 1B, and 3, each light emitting element 30 can be formed in a rectangular shape. As shown in FIG. 3, three light emitting elements 30 can be respectively arranged on three lead frames 20a, and respectively emit lights of red (R), green (G), and blue (B). A pixel is configured by mixing respective lights emitted by the three light emitting elements 30.

It is preferable that the light emitting element 30 should be specifically a light emitting diode, and such a diode with an arbitrary wavelength can be selected depending on the application. For example, example light emitting elements 30 of blue (light wavelength: 430 nm to 490 nm) and green (light wavelength: 490 nm to 570 nm) are ZnSe, a nitride-based semiconductor ($In_XAl_YGa_{1-X-Y}N$, $0 \leq X$, $0 \leq Y$, and $X+Y<1$), GaP, etc. Also, for the light emitting element 30 of red (light wavelength: 620 nm to 750 nm), GaAlAs, AlInGaP, etc., can be used.

It will be discussed later but when a fluorescent material is introduced in the encapsulation member 40 (see FIGS. 1A, 1B and 2), it is preferable to use a nitride semiconductor ($In_XAl_YGa_{1-X-Y}N$, $0 \leq X$, $0 \leq Y$, and $X+Y<1$), that can emit short-wavelength light and which can make such fluorescent material excited efficiently. The component composition of the light emitting element 30, the emitted light color thereof, the size, and the like are not limited to the above-explained ones, and can be selected accordingly depending on the purpose.

<Encapsulation Member>

The encapsulation member 40 is for protecting the light emitting element 30 and the wires 50 arranged on the lead frames 20a and 20b against dust, moisture, external force, etc. As shown in FIGS. 1A, 1B and 2, the encapsulation member 40 is formed by filling a resin in the interior of the recess 11 of the package 10.

A preferable material of the encapsulation resin 40 is a light transmissive one which can allow light from the light emitting element 30 to pass therethrough, and more specifically, it is preferable to use a silicon resin, an epoxy resin, an urea resin, and the like. Also, in addition to such materials, a colorant, a light diffusion agent, a filler, a fluorescent material, and the like can be contained.

The encapsulation member 40 can be formed of a single material, or may be formed as a plurality of layers equal to or greater than two layers. It is appropriate if the filling amount of the encapsulation member 40 is such an amount that the light emitting element 30 and the wires 50 arranged on the lead frames 20a and 20b in the recess 11 of the package 10 are just filled.

<Wires>

The wires 50 are conductive wirings that electrically connect the electrical component like the light emitting element 30 with the lead frames 20. As shown in FIGS. 1A, 1B and 3, the wires 50 electrically connect the light emitting element 30 with the lead frames 20a and 20b.

The diameter of wire 50 is not limited to any particular size, and can be selected accordingly depending on the purpose and the application. Also, example materials of the wire 50 are a metal, such as Au, Cu, Pt, or Al, and an alloy thereof, but in particular, it is preferable to use Au which is excellent in thermal conductivity.

As shown in FIG. 1A, the light emitting device 1 employing the above-explained structure is mainly used in an outdoor location and the side face thereof is covered by the waterproof resin 2. As shown in FIG. 1B, when the waterproof resin 2 starts peeling due to a long-term use, the waterproof resin 2 is prevented from being peeled up to the boundary between the package 10 and the lead frames 20a and 20b where moisture is likely to enter by the step formed by the first side face 12 formed inwardly relative to respective frame side faces 21 of the lead frames 20a and 20b and the second side face 13 protruding so as to cover respective upper parts of the bent portions 22 of the lead frames 20a and 20b, and entering of moisture like rain water can be suppressed, thereby improving the waterproof performance.

When the light emitting device 1 is used in not only an outdoor location but also an indoor location, the package side faces of the light emitting device 1 are covered by the waterproof resin 2 in some cases in order to improve the waterproof performance, and the same effect can be obtained in this case, too. Also, since the light emitting device 1 allows application of the waterproof resin 2 with reference to the side face 12, the covered level by the waterproof resin 2 can be made constant, thereby making the waterproof performance stable.

[Image Display Unit]

Next, an explanation will be given of an image display unit U using the above-explained light emitting device 1 with reference to FIGS. 4A to 5B.

Figure 4A:
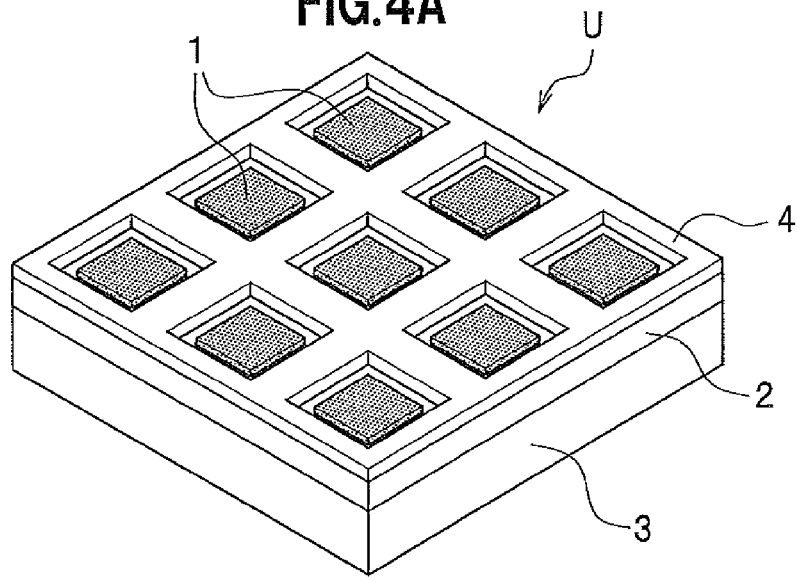
FIGS. 4A and 4B are schematic diagrams showing an image display unit using the light emitting device according to the first embodiment of the present invention.
Figure 4B:
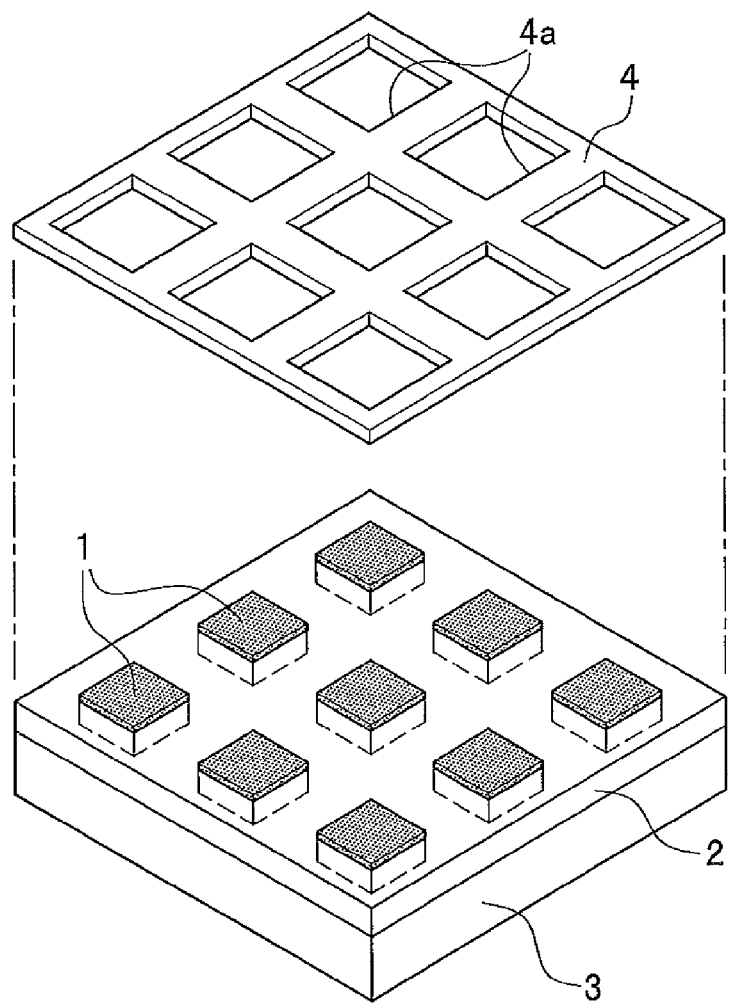

The image display unit U is configured by a plurality of light emitting devices 1 used for an image display device (display) placed in an outdoor location. As shown in FIGS. 5A and 5B, the image display unit U is used for configuring an image display device D. As shown in FIGS. 4A and 4B, the image display unit U includes the light emitting devices 1, the waterproof resin 2, a circuit board 3, and a frame member 4.

<Light Emitting Device>

As shown in FIGS. 4A and 4B, a plurality of light emitting devices 1 are arranged on the circuit board 3 via a joining member 5 (see FIGS. 6A to 6C) to be discussed later. As shown in FIGS. 4A and 4B, the light emitting devices 1 are arranged in a matrix manner three by three. The number of light emitting devices 1 configuring the image display unit U is not limited to any particular number, and can be increased or decreased depending on the purpose. The specific configuration of the light emitting device 1 is same as one explained above, so that the explanation thereof will be omitted.

<Waterproof Resin>

The waterproof resin 2 is for preventing moisture, such as rain water in an ambient air or humidity, from entering into the interior of the light emitting devices 1. The waterproof resin 2 is formed of a silicon resin, and is formed so as to cover the side face of the package 10 of each light emitting device 1 on the circuit board 3 and the frame side face 21 (see FIG. 1A).

It is preferable that the waterproof resin 2 should be formed so as to cover the frame side face 21 and the second side face 13 and a part of the first side face 12 on the circuit board 3 (see FIG. 1A). More specifically, the waterproof resin 2 is filled around the light emitting device 1 so that the end of the waterproof resin 2 is located within a plane of the first side face 12, i.e., between the upper end of the first side face 12 and the bottom end thereof (see FIG. 1A). Accordingly, as shown in FIG. 4B, the image display unit U has the waterproof resin 2 formed up to a location within a plane of the first side face 12 of the package 10, so that it can be further surely prevented that moisture like rain water enters in the interior of the light emitting device 1. Since the waterproof resin 2 is not filled up to the upper end of the first side face 12, the waterproof resin 2 can be prevented from going over on the upper face of the light emitting device 1, so that reduction of an optical output due to a light emitting face covered by the waterproof resin 2 can be prevented, and as shown in FIGS. 4A and 4B, a space for attaching the frame member 4 can be formed, facilitating the attachment of the frame member 4.

<Circuit Board>

The circuit board 3 is for arranging the plurality of light emitting devices 1 and for electrically connecting those together and mechanically holding those. As shown in FIGS. 4A and 4B, the circuit board 3 is formed in a tabular rectangular shape. The circuit board 3 is, more specifically, a glass-epoxy resin on which unillustrated constant-current drive circuit, drive control circuit, communication circuit, and the like are mounted. As shown in FIG. 4B, the plurality of light emitting devices 1 are arranged on the circuit board 3, and respective side faces of the light emitting devices 1 are covered by the waterproof resin 2.

<Frame Member>

The frame member 4 is for protecting the circuit board 3 and the waterproof resin 2 on the circuit board 3. As shown in FIGS. 4A and 4B, the frame member 4 is formed in a tabular rectangular shape and has an area corresponding to that of the circuit board 3. As shown in FIG. 4B, the frame member 4 has a plurality of openings 4a corresponding to the area of the plurality of light emitting devices 1. As shown in FIG. 4A, the frame member 4 has the plurality of openings 4a opposite to the plurality of light emitting devices 1, and is joined with the circuit board 3 by means of unillustrated screws.

The image display unit U having the above-explained structure includes the above-explained light emitting devices 1, so that even if the waterproof resin 2 starts peeling due to a long-term use, the waterproof resin 2 is prevented from being peeled up to the boundary between the package 10 and the lead frames 20a and 20b where moisture is likely to enter by the step formed by the first side face 12 formed inwardly relative to respective frame side faces 21 of the lead frames 20a and 20b and the second side face 13 protruding so as to cover respective upper parts of the bent portions 22 of the lead frames 20a and 20b, and entering of moisture like rain water can be suppressed (see FIG. 1A), thereby improving the waterproof performance.

When the image display unit U is used in not only an outdoor location but also an indoor location, the package side faces of the light emitting device 1 are covered by the waterproof resin 2 in some cases in order to improve the waterproof performance, and the same effect can be obtained in this case, too. Also, since the image display unit U allows application of the waterproof resin 2 with reference to the side face 12, the covered level by the waterproof resin 2 can be made constant, thereby making the waterproof performance stable.

[Manufacturing Method of Image Display Unit]

Next, a brief explanation will be given of a manufacturing method of the image display unit U using the light emitting devices 1. The manufacturing method of the image display unit U includes a light-emitting-device arranging process, a water-proof-resin applying process, and a frame-member attaching process. Respective processes will be briefly explained with reference to FIGS. 6A to 6C.

<Light-Emitting-Device Arranging Process>

Figure 6A:
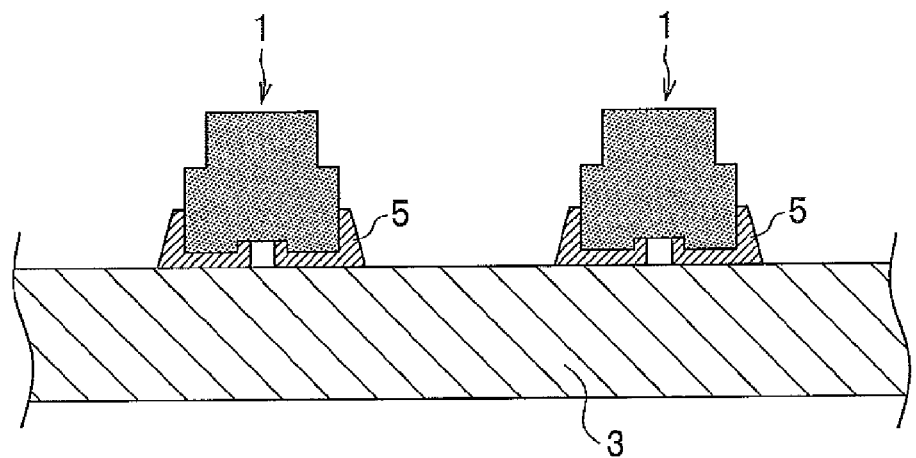
FIGS. 6A to 6C are schematic diagrams showing manufacturing processes of the image display unit using the light emitting device according to the first embodiment of the present invention.

The light-emitting-device arranging process is for arranging the plurality of light emitting devices 1 on the circuit board 3. In the light-emitting-device-arranging process, as shown in FIG. 6A, the plurality of light emitting devices 1 are arranged on the circuit board 3 at a predetermined interval, and are soldered by respective joining members 5, thereby arranging the light emitting devices 1. The light emitting devices 1 are arranged in a matrix manner three by three on the circuit board 3 (see FIGS. 4A and 4B).

<Water-Proof-Resin Applying Process>

Figure 6B:
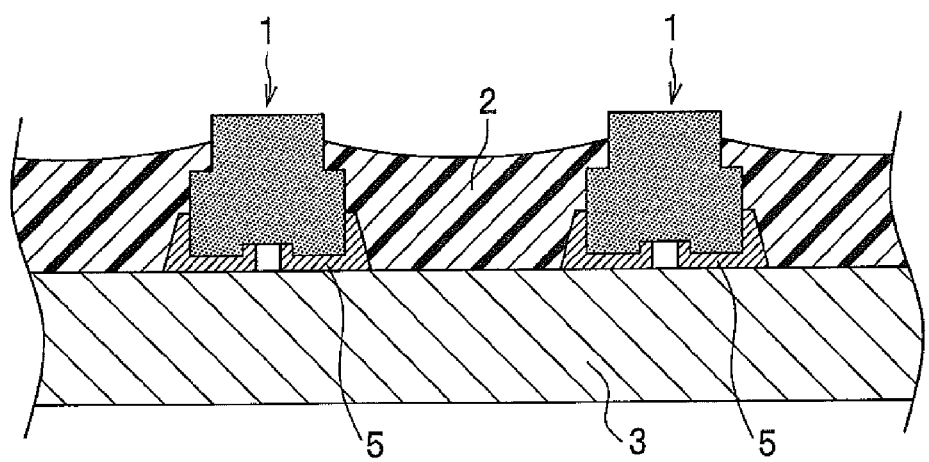

The waterproof-resin applying process is for covering respective side faces (surroundings) of the plurality of light emitting devices 1 arranged on the circuit board 3 by the waterproof resin 2. As shown in FIG. 6B, in the waterproof-resin applying process, the waterproof resin 2 is filled around the plurality of light emitting devices 1 configuring the image display unit U, and the waterproof resin 2 is formed so as to cover the side faces of the packages 10 of respective light emitting devices 1 and the frame side faces 21.

<Frame-Member Attaching Process>

Figure 6C:
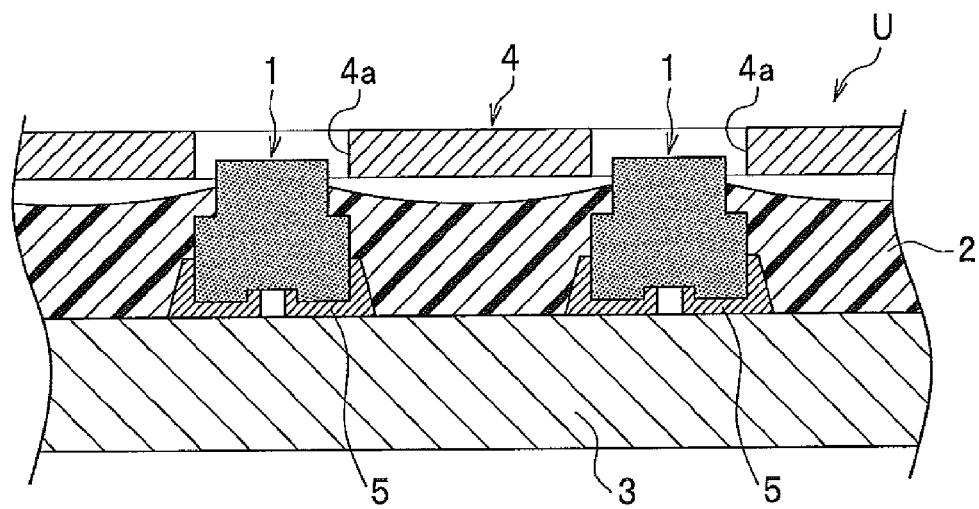

The frame-member attaching process is for attaching the frame member 4 to the circuit board 3 which is covered by the waterproof resin 2 and which has the plurality of light emitting devices 1 arranged thereon. In the frame-member attaching process, as shown in FIG. 6C, the frame member 4 is attached to the circuit board 3 so that respective light emitting devices 1 are located at respective openings 4a each corresponding to the size of each light emitting device 1, and is fastened to the circuit board 3 by means of unillustrated screws, thereby forming the image display unit U. At this time, as shown in FIG. 6C, attachment is made so that the waterproof resin 2 does not abut the rear face of the frame member 4 and is spaced apart therefrom at a predetermined clearance.

Second Embodiment

Figure 7A:
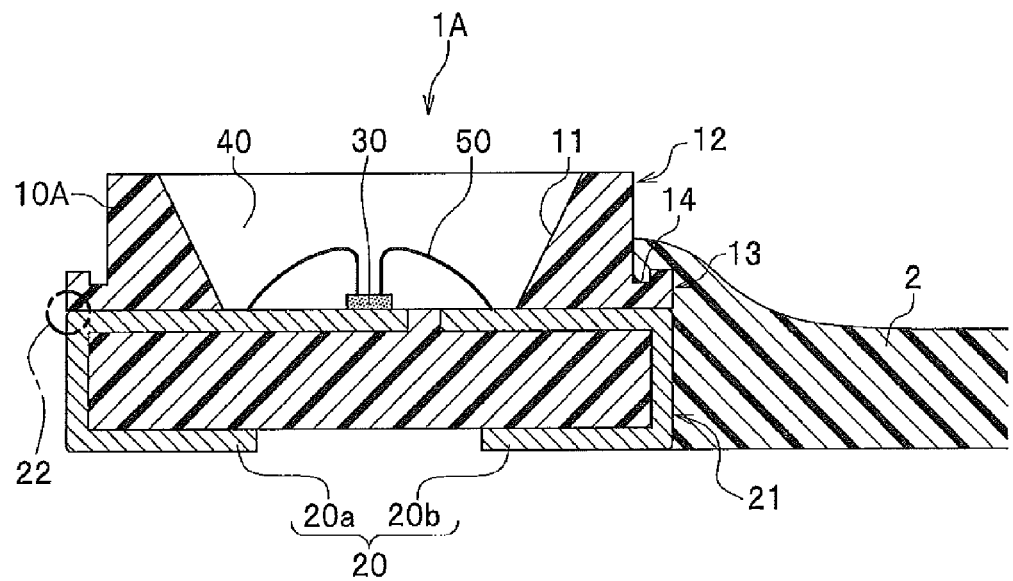
FIGS. 7A and 7B are cross-sectional views showing a structure of a light emitting device according to a second embodiment of the present invention.
Figure 7B:
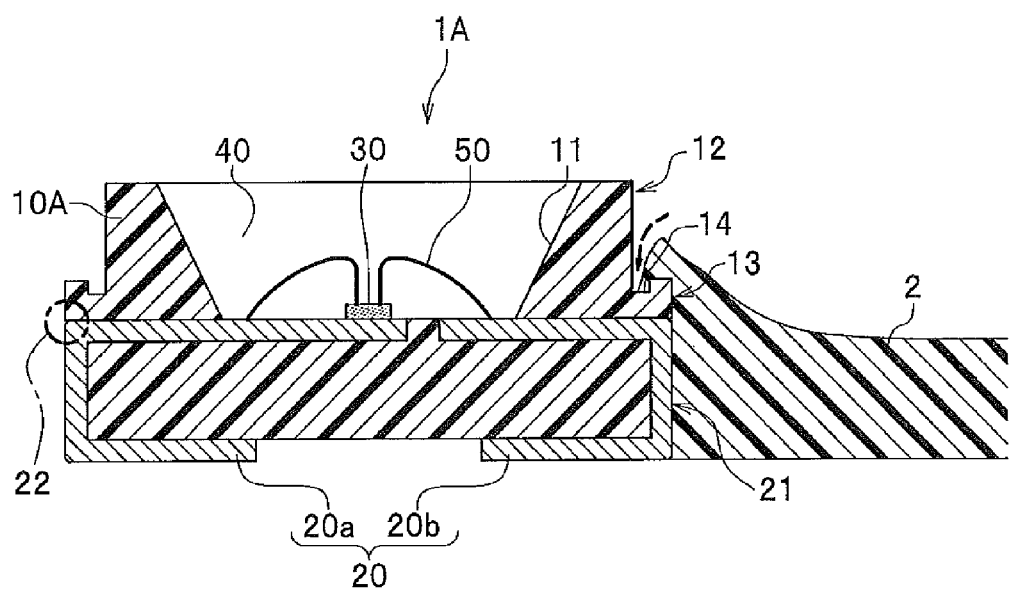

An explanation will be given of a light emitting device 1A according to a second embodiment in detail with reference to FIGS. 7A and 7B. As shown in FIGS. 7A and 7B, the light emitting device 1A employs the same structure as that of the light emitting device 1 of the first embodiment other than the shape of a package 10A. Hence, the duplicated structure with that of the above-explained light emitting device 1 will be denoted by the same reference numeral and the explanation thereof will be omitted.

As shown in FIG. 7A, the light emitting device 1A has the package 10A that has a groove 14 which is formed between the first side face 12 and the second side face 13 in the thickness direction of the package 10A at a predetermined depth. The depth and the width of the groove 14 are not limited to any particular sizes, and can be changed accordingly depending on the covered level by the waterproof resin 2.

As shown in FIG. 7A, when the light emitting device 1A employing the above-explained structure is used in an outdoor location and the side face thereof is covered by the waterproof resin 2, as shown in FIG. 7B, even if there is a possibility that the waterproof resin 2 is peeled due to a long-term use, the groove 14 formed between the first side face 12 and the second side face 13 can prevent the waterproof resin 2 from being peeled from the package 10A. Also, even if the waterproof resin 2 starts peeling from the side face, the groove 14 can suppress a progress of the peeling of the waterproof resin 2, so that entering of moisture like rain water can be suppressed, and thus the light emitting device 1A has an improved waterproof performance.

Third Embodiment

Figure 8A:
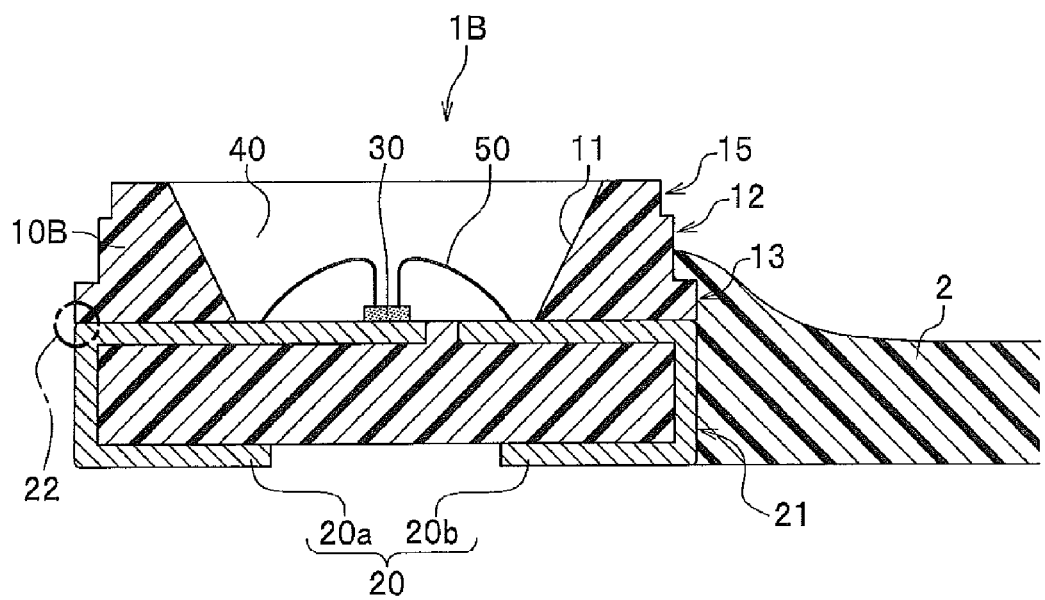
FIGS. 8A and 8B are cross-sectional views showing a structure of a light emitting device according to a third embodiment of the present invention.
Figure 8B:
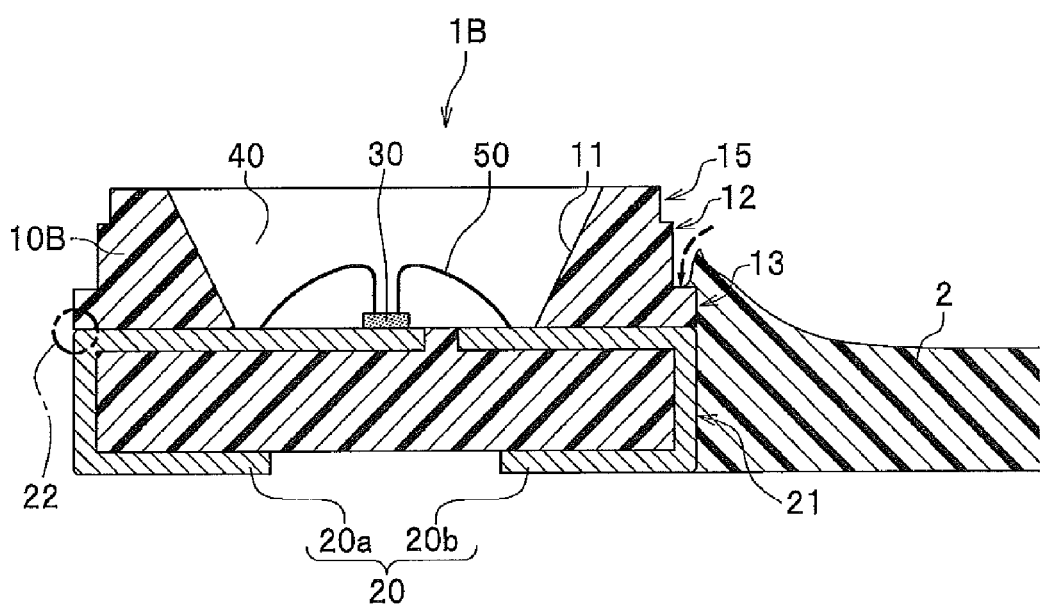

An explanation will be given of a light emitting device 1B according to a third embodiment in detail with reference to FIGS. 8A and 8B. As shown in FIGS. 8A and 8B, the light emitting device 1B employs the same structure as that of the light emitting device 1 of the first embodiment other than the shape of a package 10B. Hence, the duplicated structure with that of the above-explained light emitting device 1 will be denoted by the same reference numeral and the explanation thereof will be omitted.

As shown in FIGS. 8A and 8B, the light emitting device 1B has the package 10B that includes a third side face 15 formed inwardly relative to the first side face 12 at the light-emitting-surface side of the light emitting device 1B from the first side face 12. The light emitting surface means the surface of the encapsulation resin 40 shown in FIGS. 8A and 8B, and the light-emitting-surface side of the light emitting device 1B from the first side face 12 means a direction from the first side face 12 toward the surface of the encapsulation resin 40.

Like the first side face 12, the third side face 15 is formed along two side faces defined by the pair of lead frames 20 when the package 10B is viewed in a cross-sectional view. How much the third side face 15 is formed inwardly relative to the first side face 12 is not limited to any particular level, and can be changed accordingly depending on the covered level by the waterproof resin 2.

As shown in FIG. 8B, when the light emitting device 1B employing the above-explained structure is used in an outdoor location and the side face thereof is covered by the waterproof resin 2, even if the waterproof resin 2 starts peeling due to a long-term use, a step formed between the first side face 12 and the second side face 13 can suppress a progress of the peeling of the waterproof resin 2 from the package 10B, and entering of moisture like rain water can be suppressed, thereby improving the waterproof performance. Also, when the light emitting device 1B is used in an outdoor location and the side face thereof is covered by the waterproof resin 2, the waterproof resin 2 can be applied with reference to the third side face 15, so that the covered level by the waterproof resin 2 can be made constant, thereby making the waterproof performance stable.

Also, when the amount of encapsulation resin 40 varies at the time of manufacturing and the encapsulation resin 40 is leaked out from the recess 11, the light emitting device 1B can suppress the leakage of the encapsulation resin 40 by the step formed between the second side face 13 and the third side face 15. Accordingly, the light emitting device 1B can prevent the encapsulation resin 40 from sticking to the lead frame 20 at the time of manufacturing, thereby suppressing a bonding failure between the lead frame 20 and a bonding member like a solder.

At the time of manufacturing, when the amount of encapsulation resin 40 varies, the encapsulation resin 40 is leaked out from the recess 11, and the encapsulation resin 40 sticks to a surface of the package 10B that is bonded with the waterproof resin 2 (i.e., the second side face 13), the adhesiveness with the waterproof resin 2 may decrease. However, as explained above, since the leakage of the encapsulation resin 40 is suppressed by the step formed between the second side face 13 and the third side face 15 in order to prevent the encapsulation resin 40 from sticking to the surface that is bonded with the waterproof resin 2 (i.e., the second side face 13), the reduction of the adhesiveness of the light emitting device 1B with the waterproof resin 2 can be suppressed.

Fourth Embodiment

Figure 9A:
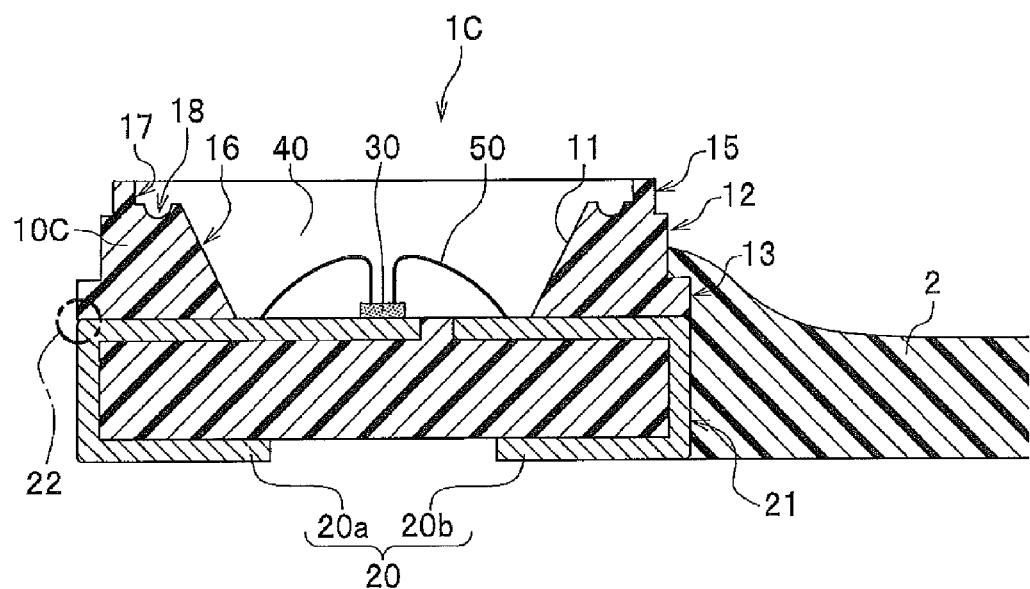
FIGS. 9A and 9B are cross-sectional views showing a structure of a light emitting device according to a fourth embodiment of the present invention.
Figure 9B:
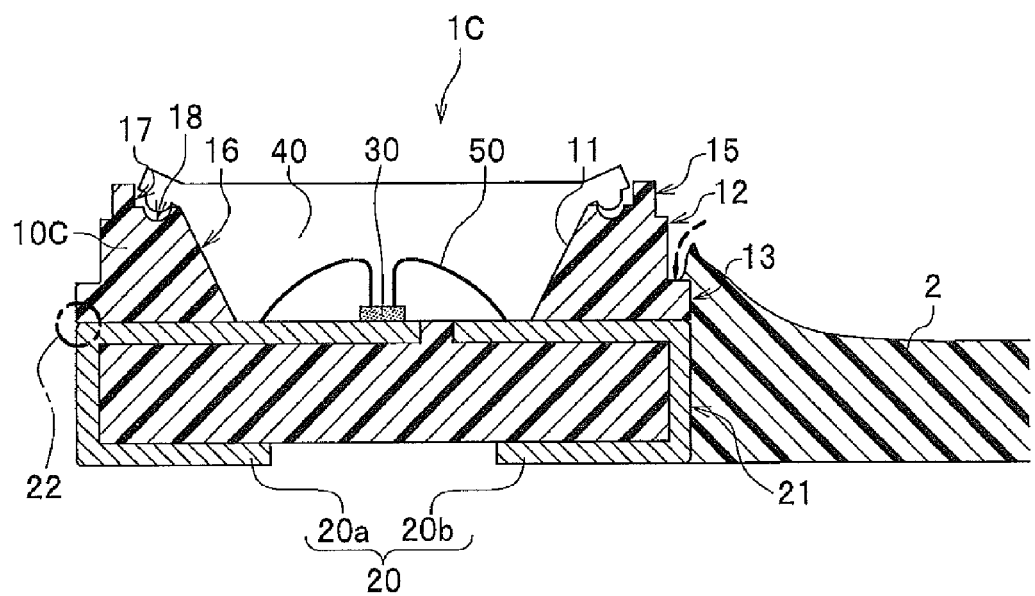

A light emitting device 1C according to a fourth embodiment will be explained in detail with reference to FIGS. 9A and 9B. As shown in FIGS. 9A and 9B, the light emitting device 1C employs the same structure as that of the light emitting device 1B of the third embodiment other than the shape of a package 10C. Accordingly, the duplicated structure with the above-explained light emitting device 1B will be denoted by the same reference numeral and the explanation thereof will be omitted.

As shown in FIGS. 9A and 9B, the light emitting device 1C has the package 10C that includes a first inner side face 16 and a second inner side face 17 formed outwardly of the light emitting device 1C relative to the first inner side face 16. The first inner side face 16 and the second inner side face 17 are located inside the recess 11. As shown in FIGS. 9A and 9B, the package 10C has a second groove 18 that is formed between the first inner side face 16 and the second inner side face 17 in the thickness direction of the package 10C at a predetermined depth. As shown in FIG. 9A, the portion where the second groove 18 is formed is filled by the encapsulation resin 40. The depth and the width of the second groove 18 are not limited to any particular sizes, and can be changed accordingly depending on the amount of the encapsulation resin 40 filled in the second groove 18.

According to the light emitting device 1C employing the above-explained structure, the second groove 18 improves the adhesiveness between the encapsulation resin 40 and the package 10C, and thus peeling of the encapsulation resin 40 from the package 10C can be suppressed. Also, as shown in FIG. 9A, when the light emitting device 1C is used in an outdoor location and the side face thereof is covered by the waterproof resin 2, as shown in FIG. 9B, even if not only the waterproof resin 2 but also the encapsulation resin 40 start peeling due to a long-term use, the second groove 18 formed between the first inner side face 16 and the second inner side face 17 can prevent moisture like rain water from entering inside the light emitting device 1C, thereby improving the waterproof performance.

Fifth Embodiment

Figure 10:
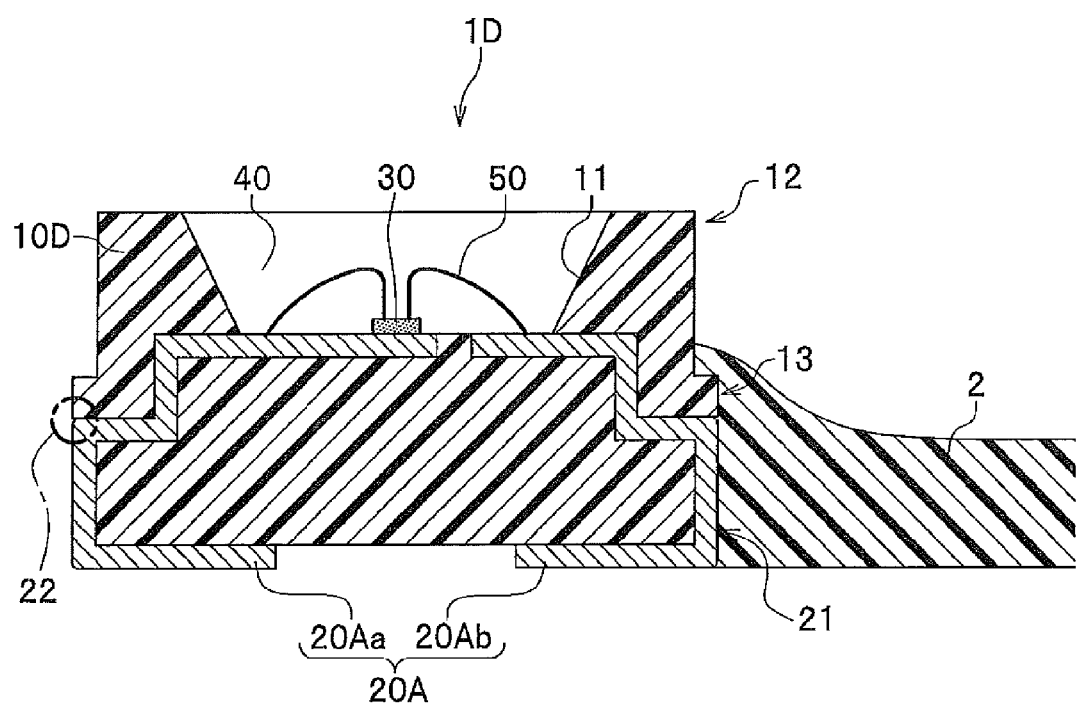
FIG. 10 is a cross-sectional view showing a structure of a light emitting device according to a fifth embodiment of the present invention.

An explanation will be given of a light emitting device 1D according to a fifth embodiment in detail with reference to FIG. 10. As shown in FIG. 10, the light emitting device 1D employs the same structure as that of the light emitting device 1 of the first embodiment other than respective shapes of a package 10D and lead frames 20A. Hence, the same structure as that of the above-explained light emitting device 1 will be denoted by the same reference numeral and the explanation thereof will be omitted.

As shown in FIG. 10, the light emitting device 1D has the package 10D formed thicker than that of the light emitting device 1 of the first embodiment, and has lead frames 20Aa and 20Ab folded in the interior of the package 10D. As shown in FIG. 10, the light emitting device 1D has a flat plane where the light emitting element 30 is arranged, i.e., the bottom of the recess 11 provided at a higher location (closer location to the light emitting surface of the light emitting device 1D) than external bent portions 22 of the package 10D, and has the second side face 13 provided at a lower location (closer to a mount face of the light emitting device 1D) than the bottom of the recess 11. Also, as shown in FIG. 10, the waterproof resin 2 is formed so as to cover at least the second side face 13, and so as not to cover the light emitting surface (upper face) of the light emitting device 1D.

In order to form the waterproof resin 2 so as not to cover the light emitting surface of the light emitting device 1D, it is preferable that the recess 11 should be formed deeply and the distance between the second side face 13 and the light emitting surface should be elongated as much as possible. However, if the package 10D is in such a shape, the distance between the light emitting surface of the light emitting device 1D and the light emitting element 30 becomes large, and light does not easily go out due to reflection and optical absorption against the inner wall of the recess 11 of the package 10D.

However, as explained above, the light emitting device 1D has the bottom face of the recess 11 provided at a higher location than the external bent portions 22 of the package 10D, so that the distance between the light emitting element 30 and the light emitting surface becomes small. Also, since the second side face 13 is provided at a lower location than the bottom face of the recess 11, the distance between the second side face 13 and the light emitting surface also becomes large. Therefore, according to the light emitting device 1D, both high output and improvement of yield can be simultaneously accomplished.

It is preferable that a height from the second side face 13 to the light emitting surface should be a height that enables formation of the waterproof resin 2 with a good yield, and for example, should be several mm or so. Also, as shown in FIG. 10, by increasing the height of the first side face 12, the light emitting device 1D increases the distance between the second side face 13 and the light emitting surface. However, like the light emitting device 1B explained in the third embodiment, a third side face 15 may be further formed.

Although the light emitting devices 1, 1A, 1B, 1C, and 1D and the image display unit U of the present invention were explained in detail through the preferred embodiments, the present invention is not limited to the above-explained embodiments, and should be interpreted in a broad meaning based on the appended claims Various changes and modifications based on the above-explained embodiments should be included within the scope and the spirit of the present invention. Respective embodiments may be carried out in a combined manner. For example, the light emitting device 1 explained in the first embodiment may be combined with the second groove 18 explained in the fourth embodiment and shown in FIGS. 9A and 9B.

For example, the light emitting devices 1, 1A, 1B, 1C, and 1D employ respective structures having three light emitting elements 30 corresponding to R, G, and B in respective recesses 11, but for example, a light emitting element 30 corresponding to any one of R, G, and B may be arranged and the plurality of light emitting devices 1, 1A, 1B, 1C, and 1D each having such light emitting element 30 may be arranged proximately to one another in order to form a pixel.

Also, the light emitting devices 1, 1A, 1B, 1C, and 1D employ respective structures having the three light emitting elements 30 corresponding to R, G, and B in respective recesses 11, but for example, a protective element like a Zener diode may be further arranged.

I claim:

1. An image display unit comprising:
a circuit board;
a plurality of surface-mount type light emitting devices disposed on the circuit board; each of the light emitting devices having a package, the package having a first resin side face and a second resin side face, the second resin side face protrudes from the first resin side face; and
a waterproof resin disposed on the circuit board, the waterproof resin covering the second resin side face of the package and only a part of the first resin side face of the package.

2. The image display unit according to claim 1, wherein upper end of the waterproof resin is located within a plane of the first resin side face of the package.

3. The image display unit according to claim 1, wherein the package having a recess,
a pair of lead frames buried in the package so that one end of each lead frame is exposed at a bottom of the recess and another end of each lead frame protrudes from the package;
a light emitting element disposed on an exposed portion of at least one of the pair of lead frames;
an encapsulant filling the recess, and
the waterproof resin covering the lead frame.

4. The image display unit according to claim 1, wherein the package having a side face protruding portion protruded from the first resin side face of the package, the side face protruding portion covers a top of a protruding portion of lead frames, the side face protruding portion having the second resin side face of the side face so as to protrude from the first resin side face,
wherein a length of the first resin side face in a direction perpendicular to a bottom face of the package is larger than a length of the second resin side face in the perpendicular direction.

5. The image display unit according to claim 1, wherein the another end of each lead frame is bent to follow the first resin side face of the package and a bottom face of the package, and a protruding portion of lead frames covered by a side face protruding portion corresponds to a lead frame disposed on the side face as part of a bending end of the each lead frame.

6. The image display unit according to claim 1, wherein the waterproof resin covers a protruding portion of lead frames, the second resin side face and part of the first resin side face.

7. The image display unit according to claim 1, further comprising a frame member having a plurality of openings and joined with the circuit board, the plurality of the light emitting devices being arranged in the plurality of openings.

8. The image display unit according to claim 1, wherein the package further includes a groove that is formed between the first resin side face and the second resin side face so as to extend in a direction perpendicular to a bottom face of the package.

9. The image display unit according to claim 1, wherein the package further includes a third side face of the side face of the package disposed inwardly relative to the first resin side face.

10. A surface-mount type light emitting device comprising:
a package having a top face, a bottom face and a side face, the side face having a step-like structure having a first side face, a second side face protruding from the first side face and a connecting face connecting the first and second side faces;
a lead frame partially embedded in the package so that part of the lead frame is disposed outside the package on the side face, the outside part of the lead frame protruding from the first side of the side face, and the protruding step-like structure of the side face being adjacent the protruding outside part of the lead frame and covering a top of the protruding outside part of the lead frame;
a light emitting device disposed in a recess in the package having an opening at the top face of the package so as to be connected to the lead frame; and
a waterproof resin disposed on the side face so as to cover the outside part of the lead frame, the second side face, the connecting face and part of the first side face,
wherein upper end of the waterproof resin is lower than an upper end of the first side face.

11. The image display unit according to claim 7, wherein the package further includes a groove that is formed between the first resin side face and the second resin side face so as to extend in a direction perpendicular to a bottom face of the package.

12. The image display unit according to claim 7, wherein the package further includes a third side face of the side face of the package disposed inwardly relative to the first resin side face.

* * * * *